(12) United States Patent
Orlowski et al.

(10) Patent No.: US 7,772,584 B2
(45) Date of Patent: Aug. 10, 2010

(54) LATERALLY GROWN NANOTUBES AND METHOD OF FORMATION

(75) Inventors: Marius K. Orlowski, Austin, TX (US); Shahid Rauf, Pflugerville, TX (US); Peter L. G. Ventzek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/099,557

(22) Filed: Apr. 8, 2008

(65) Prior Publication Data

US 2008/0211102 A1 Sep. 4, 2008

Related U.S. Application Data

(62) Division of application No. 11/240,241, filed on Sep. 30, 2005, now Pat. No. 7,371,677.

(51) Int. Cl.
*H01L 29/12* (2006.01)
(52) U.S. Cl. .................. 257/10; 257/E51.04; 977/742; 977/939; 438/20
(58) Field of Classification Search .................. 257/10, 257/E51.04; 977/742, 939; 313/495; 438/20
See application file for complete search history.

(56) References Cited

U.S. PATENT DOCUMENTS

| | | | |
|---|---|---|---|
| 5,227,013 | A | 7/1993 | Kumar |
| 6,420,092 | B1 | 7/2002 | Yang et al. |
| 6,515,339 | B2 * | 2/2003 | Shin et al. .................. 257/368 |
| 6,709,471 | B2 | 3/2004 | Miyamoto |
| 6,720,267 | B1 | 4/2004 | Chen et al. |
| 6,803,840 | B2 * | 10/2004 | Hunt et al. .................. 333/186 |
| 6,890,233 | B2 * | 5/2005 | Hsu .................. 445/24 |
| 7,253,065 | B2 * | 8/2007 | Appenzeller et al. ........ 438/299 |
| 2003/0068432 | A1 * | 4/2003 | Dai et al. ...................... 427/58 |
| 2005/0118090 | A1 | 6/2005 | Shaffer et al. |

OTHER PUBLICATIONS

Horng-Chih Lin, Chun-Jung Su, "High-Performance Poly-Si Nanowaire NMOS Transistors", Mar. 2007, IEEE Transactions on Nanotechnology, vol. 6.*

Nihei et al; "Simultaneous Formation of Multiwall Carbon and their End-Bonded Ohmic Contacts to Ti Electrodes for Future ULSI Interconnects"; Japanese Journal of Applied Physics, vol. 43, No. 40, 2004, pp. 1856-1859.

(Continued)

*Primary Examiner*—Davienne Monbleau
*Assistant Examiner*—Shweta Mulcare
(74) *Attorney, Agent, or Firm*—James L. Clingan, Jr.; Robert L. King

(57) ABSTRACT

A semiconductor device has lateral conductors or traces that are formed of nanotubes such as carbon. A sacrificial layer is formed overlying the substrate. A dielectric layer is formed overlying the sacrificial layer. A lateral opening is formed by removing a portion of the dielectric layer and the sacrificial layer which is located between two columns of metallic catalysts. The lateral opening includes a neck portion and a cavity portion which is used as a constrained space to grow a nanotube. A plasma is used to apply electric charge that forms an electric field which controls the direction of formation of the nanotubes. Nanotubes from each column of metallic catalyst are laterally grown and either abut or merge into one nanotube. Contact to the nanotube may be made from either the neck portion or the columns of metallic catalysts.

16 Claims, 4 Drawing Sheets

OTHER PUBLICATIONS

Klinke et al; "Comparative Study of the Catalytic Growth of Patterned Carbon Nanotube Films"; 2001 Elsevier Science BV, 2001, pp. 195-201.

Li et al; "Bottom-up Approach for Carbon Nanotube Interconnects"; Applied Physics Letters, Apr. 2003, vol. 82, No. 15, pp. 2491-2493.

Kreupl et al; "Carbon Nanotubes for Interconnect Applications"; IEEE 2004.

Avigal et al; "Growth of Aligned Carbon Nanotubes by Biasing During growth"; Applied Physics Letters, Apr. 2001, vol. 78, No. 16, pp. 2291-2293.

Bower et al; "Plasma-Induced Alignment of Carbon Nanotubes"; Applied Physics Letters, vol. 77, No. 6, pp. 830-832, Aug. 2000.

Subramanian, A. et al.; "Assembly of Arrays of Individual Lateral Nanotube Emitters on Nanoelectrodes"; Proceedings of 2005 5th IEEE Conference on Nanotechnology; Jul. 2005; IEEE.

International Search Report and Written Opinion mailed Sep. 10, 2008 in Corresponding Application PCT/US06/37897.

Restriction Requirement mailed Apr. 25, 2007 in U.S. Appl. No. 11/240,241.

Non-final Office Action mailed Aug. 7, 2007 in U.S. Appl. No. 11/240,241.

Notice of Allowance mailed Jan. 10, 2008 in U.S. Appl. No. 11/240,241.

* cited by examiner

LATERALLY GROWN NANOTUBES AND METHOD OF FORMATION

FIELD OF THE INVENTION

This invention relates generally to integrated circuits, and more particularly to nanotubes that are laterally grown.

RELATED ART

The use of copper interconnect was a significant improvement over aluminum because of its lower resistance. As dimensions decline due to the continued improvements in lithography and processing driven by the benefits of higher density, copper exhibits an adverse characteristic to the corresponding scaling in interconnect dimensions. One material that shows promise in overcoming this eventual problem of copper is carbon nanotubes. Carbon nanotubes having a diameter of about 10 nanometers can be grown and have a much lower resistance than copper of the same dimension. Lower resistance is available in carbon nanotubes by having a bundle of them or by making them to have a larger diameter. Some non-carbon nanotubes such as nickel and silicon nanotubes are metallic and are also interconnect conductor candidates Copper lines at 10 nanometers is a challenge but expected to be possible soon, even manufacturable. The resistivity, however, increases at that dimension far greater than would be predicted if copper demonstrated a linear relationship between cross sectional area and resistance at a width of 10 nanometers.

One of the difficulties with carbon nanotubes has been the difficulty in forming them laterally, which is what is preferred for manufacturing interconnect layers in semiconductors. Most carbon nanotubes have been grown in random, haphazard way. Recently there has been found a way to grow them vertically. Both of these have been useful in showing the valuable characteristics of carbon nanotubes for vias, but neither achieve the needed replacement of copper interconnect layers.

Thus, there is a need to be able to make nanotubes, particularly carbon nanotubes, laterally in a manner that the manufacturing of semiconductors using nanotubes more feasible.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

In one aspect, a middle layer is sandwiched between two other layers in which the middle layer is selectively etchable with respect to the other two layers. Three holes in a line are made through the top layer of the other two layers and through the middle layer. One hole is a center hole that is substantially halfway between the other two holes which are the end holes. The center hole is covered while a catalyst liner is formed in the end holes. The end holes are then covered and the center hole is exposed. An isotropic etch is used to remove the portion of the middle layer between the two end holes that have the catalyst. The etch is continued until the catalyst liner is exposed along the side that adjoined the middle layer. With the side of the catalyst liner exposed, carbon nanotube growth is achieved by allowing the precursor to reach the catalyst liners through the center hole. The growth is continued until the carbon nanotubes are joined. A conductive plug can be formed in the center hole to ensure that the two carbon nanotubes are electrically connected. This completes a lateral carbon nanotube line that connects to the two end holes. Vias can be made to the end holes as well as to the center hole. This is better understood with reference to the FIGs. and the following description.

Figure 1:
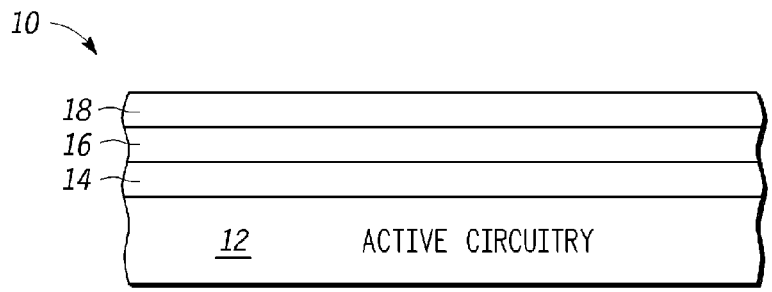
FIG. 1 is a cross section of a semiconductor device at a stage in a process according to an embodiment of the invention.

Shown in FIG. 1 is a semiconductor device 10 having active circuitry 12, an insulating layer 14, an insulating layer 16, and an insulating layer 18. Active circuitry 12 is a collection of transistors and other circuit elements formed in and on a semiconductor substrate. Active circuitry 12 can be for any function and would need to have vias to connect to overlying interconnect layers. Insulating layer 14 functions as an interlayer dielectric between an interconnect layer to be formed and active circuitry 12 in this example. Alternatively, insulating layer 14 could be overlying another interconnect layer. Insulating layer 16 is of material that can be selectively etched relative to insulating layers 14 and 18. In this example, insulating layers 14 and 18 are silicon oxide and insulating layer 16 is silicon nitride.

Figure 2:
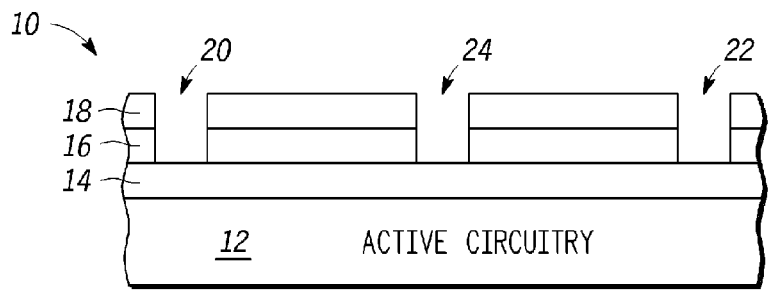
FIG. 2 is a cross section of the semiconductor device of FIG. 1 at subsequent stage in the process.

Shown in FIG. 2 is semiconductor device 10 after formation of openings 20, 22, and 24 through insulating layers 18 and 16. Opening 24 is preferably substantially centered between openings 20 and 22.

Figure 3:
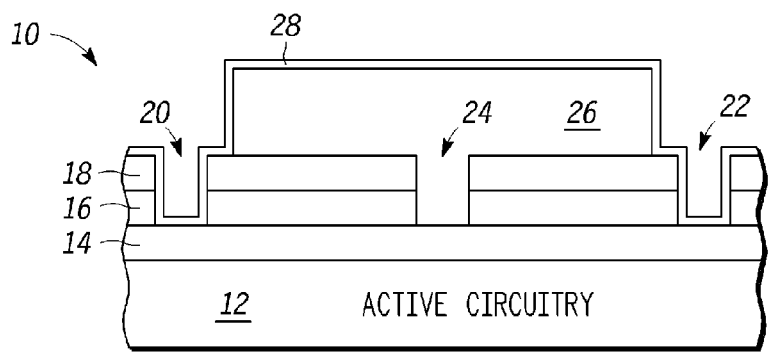
FIG. 3 is a cross section of the semiconductor device of FIG. 2 at subsequent stage in the process.

Shown in FIG. 3 is semiconductor device 10 after formation of a masking layer 26 over opening 24 that leaves openings 20 and 22 exposed. After formation of masking layer 26, a catalyst liner 28 is formed in openings 20 and 22. Catalyst liner 28 also covers masking layer 26. Catalyst liner 28 is chosen for its ability to act as a seed layer for growing carbon nanotubes. One such material is cobalt. The individual catalyst materials may be alone or in combination. Other choices include iron, molybdenum, and nickel. Other materials may be effective for this purpose as well. Masking layer 26 is preferably photoresist but could be another masking material. Photoresist is particularly advantageous because it can be directly patterned and is useful in removing material deposited on it in a lift off process.

Figure 4:
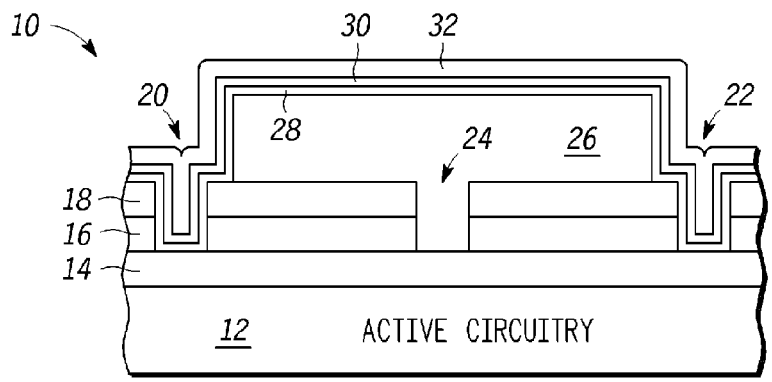
FIG. 4 is a cross section of the semiconductor device of FIG. 3 at subsequent stage in the process.

Shown in FIG. 4 is semiconductor device 10 after formation of a metal liner 30 on catalyst liner 28 and a metal plug layer 32 on metal liner 30. Metal liner 30 is preferably tantalum. Other materials include aluminum, tantalum nitride, carbon nanotubes, and titanium nitride. Other conductive materials may also effective. Metal plug layer 32 is preferably copper. Another material that may also be used is tungsten. Other materials that may be effective as plugs are other upstanding conductive nanotubes that could be selectively deposited in openings 20 and 22 with an appropriate liner and catalyst. Nickel nanotubes may be used this way. Other materials may also be effective as a plug.

Figure 5:
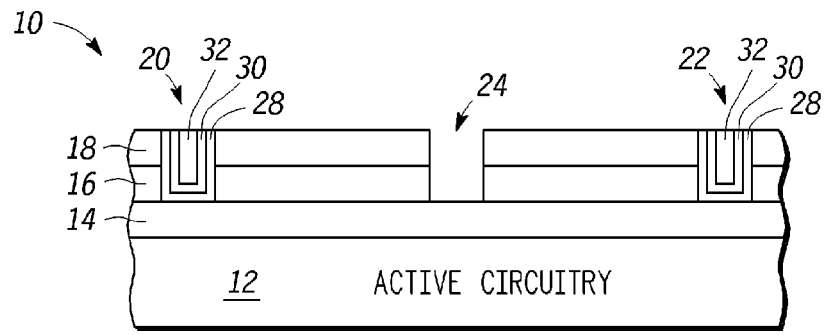
FIG. 5 is a cross section of the semiconductor device of FIG. 4 at subsequent stage in the process.

Shown in FIG. 5 is semiconductor device 10 after removing masking layer 26 by a lift off process that has the effect of removing catalyst liner 28, metal liner 30, and metal plug layer 32 that are over masking layer 26. A chemical mechanical polishing (CMP) step is used to remove the remainder of catalyst liner 28, metal liner 30, and metal plug layer 32 that are not in openings 20 and 22.

Figure 6:
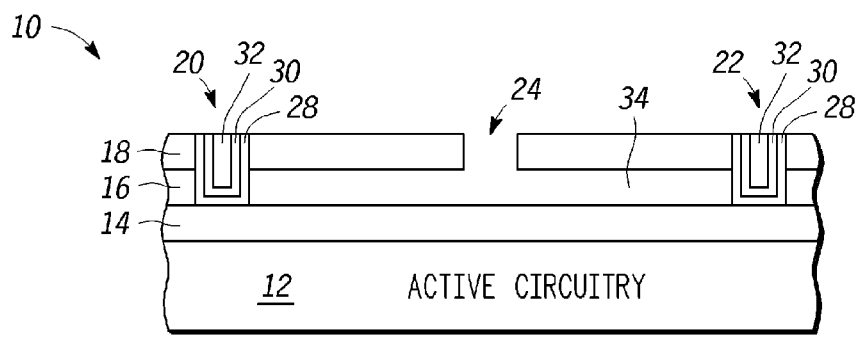
FIG. 6 is a cross section of the semiconductor device of FIG. 5 at subsequent stage in the process.

Shown in FIG. 6 is semiconductor device 10 after applying an isotropic etch that removes insulating layer 16 in the area between openings 20 and 22. This exposes the outer sidewalls of the catalyst liners 28 of openings 20 and 22 in the area between them. With insulating layers 14 and 18 being oxide and layer 16 being nitride in this example, a wet etchant is effective. Hot phosphoric acid, for example, is an effective wet etchant in this case. A dry etch could also be used of, for example, xenon and fluorine plasma. Opening 24 then is like a neck that opens to a cavity 34 in the region between catalyst liners 28 of openings 20 and 22.

Figure 7:
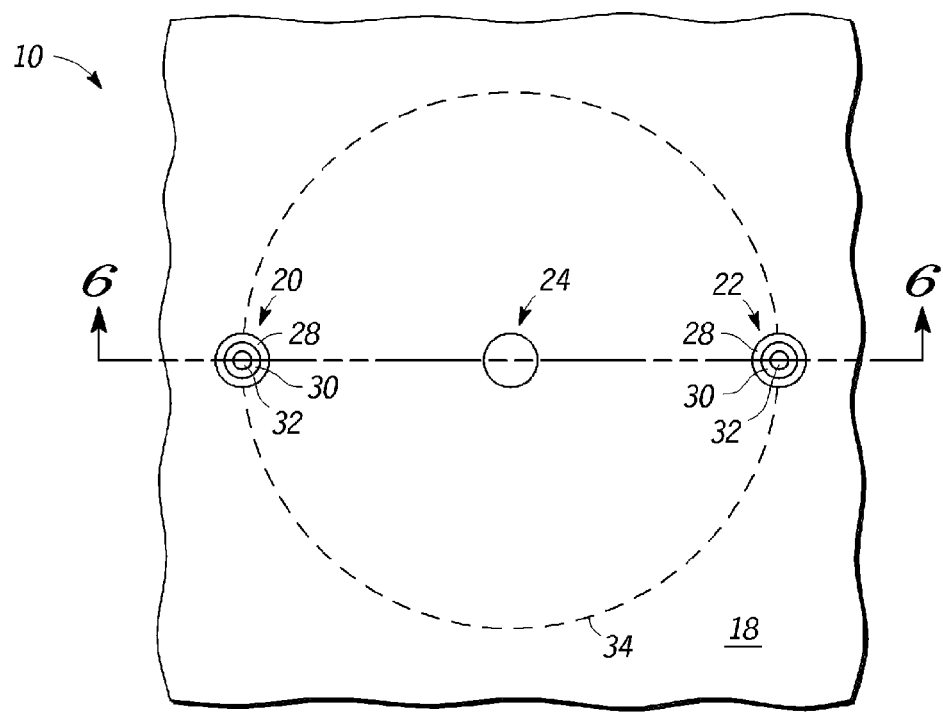
FIG. 7 is a top view of the semiconductor device of FIG. 6.

Shown in FIG. 7 is a top view of semiconductor device 10 as shown in FIG. 6. This shows that the isotropic etch results in cavity 34 being substantially circular. An alternative is to first form a trench and form layer 16 in the trench. The trench approach requires an alignment to the trench in the formation of openings 20, 22, and 24. It also requires additional processing steps.

Figure 8:
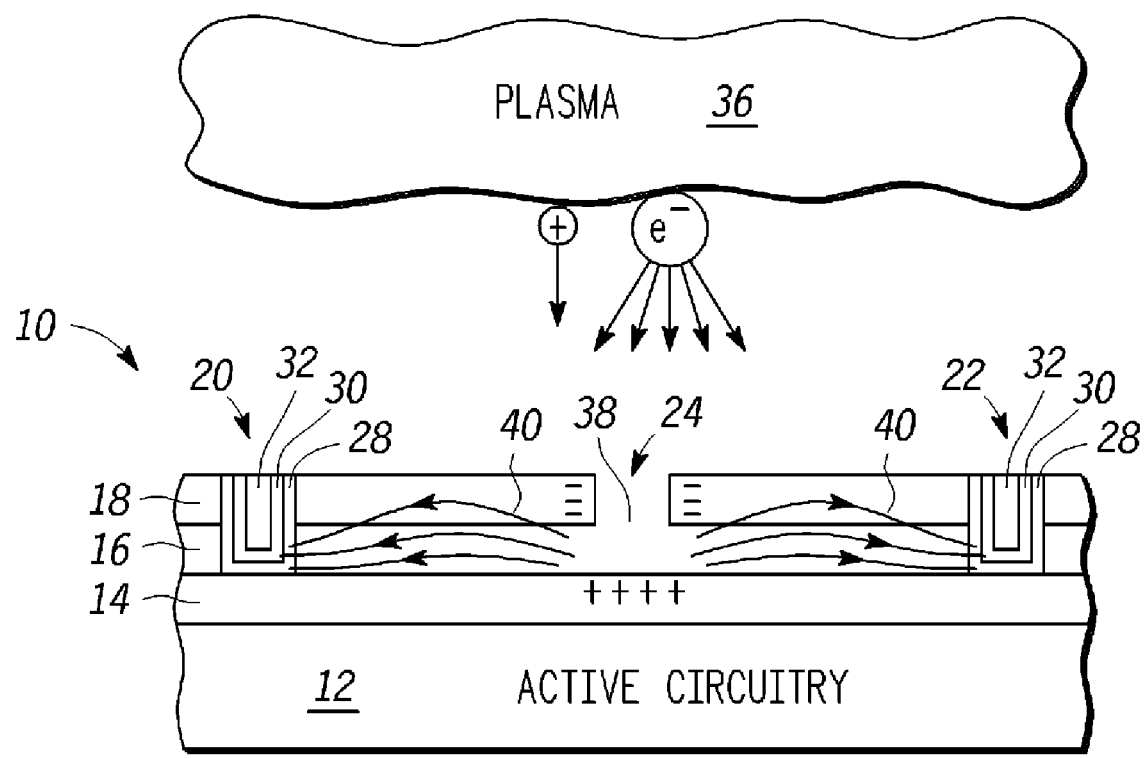
FIG. 8 is a cross section of the semiconductor device of FIG. 6 at subsequent stage in the process.

Shown in FIG. 8 is semiconductor device 10 after application of a plasma 36 for a precursor for forming carbon nanotubes from catalyst liners 28. In this example the precursor is preferably acetylene and hydrogen. Other examples are other hydro-carbons as a replacement for acetylene. Other plasmas are also possible. Possible replacements for hydrogen include $NH_3$ and argon. The plasma has the effect of establishing negative charge from electrons along opening 24 and a positive charge 38 from positively charged ions on the bottom of cavity 34 under opening 24. This type of charging arrangement is a known effect from plasma that is generally considered deleterious. In this case, however, the charge arrangement is useful in setting an electric field 40 between positive charge 38 and catalyst liners 28 that sets a growth direction for nanotube growth. In addition, it may be advantageous to provide a charge establishing step prior to the plasma deposition. For example, a plasma step of argon alone may be effective for this purpose.

Figure 9:
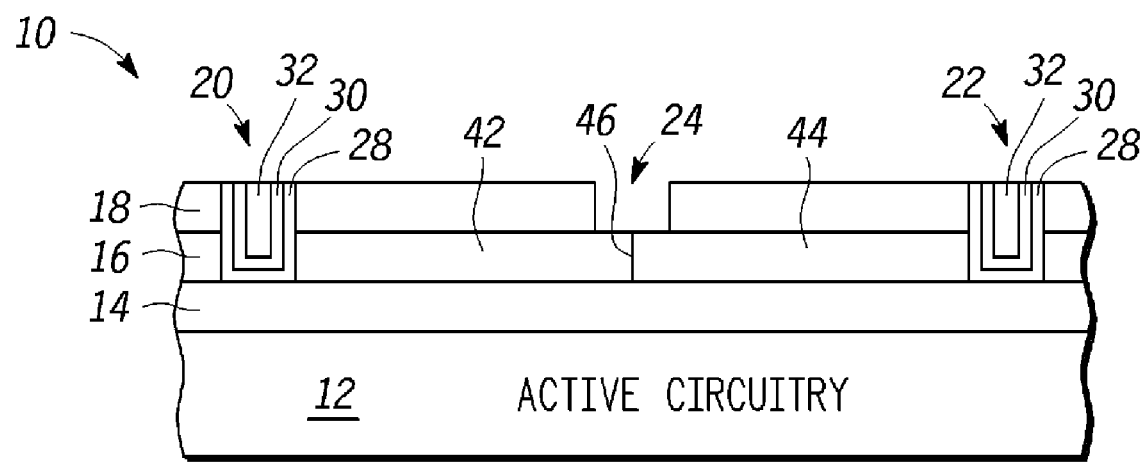
FIG. 9 is a cross section of the semiconductor device of FIG. 8 at subsequent stage in the process.

Shown in FIG. 9 is semiconductor device 10 after the effect of applying plasma 36 to result in the formation of carbon nanotube 42 and carbon nanotube 44 that come together at a seam 46. One approach for establishing an electrical contact at seam 46 is welding of the two carbon nanotubes by plasma.

Figure 10:
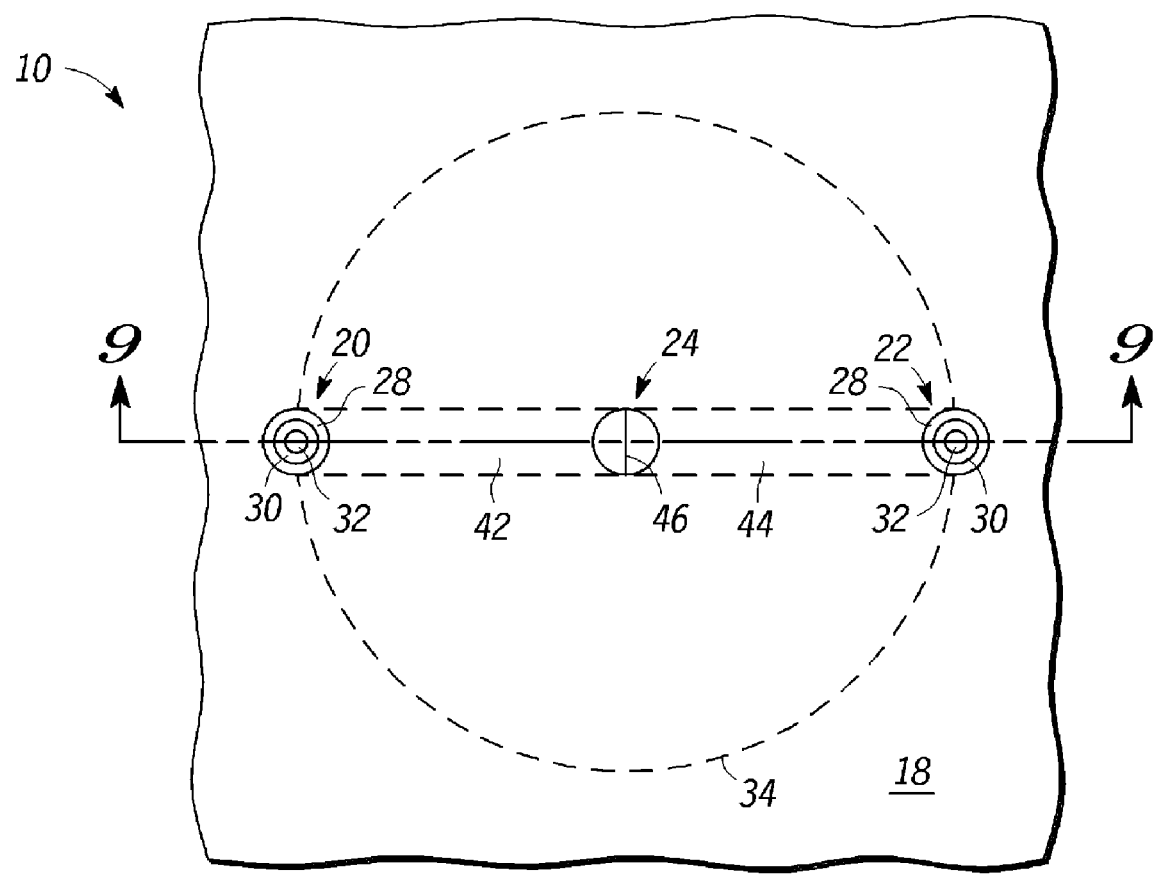
FIG. 10 is a top view of the semiconductor device of FIG. 9.

Shown in FIG. 10 is semiconductor device 10 in a top view of the cross section shown in FIG. 9. This shows that carbon tube 42 is formed in straight lines from catalyst liners 28 to opening 24. This shows that carbon tubes 42 and 44 are under insulating layer 18 but can be contacted at openings 20, 22, and 24.

Figure 11:
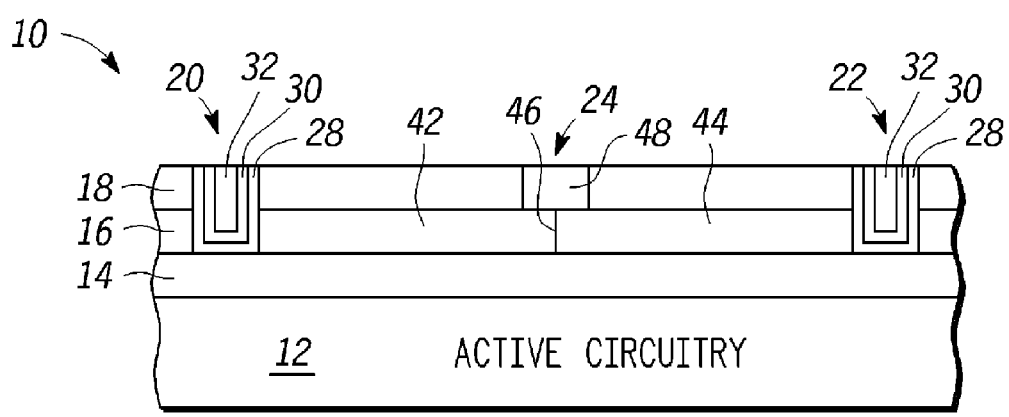
FIG. 11 is a cross section of the semiconductor device of FIG. 9 at subsequent stage in the process.

Shown in FIG. 11 is semiconductor device 10 after formation of a conductive plug 48 that ensures that carbon nanotubes 42 and 44 are electrically connected and form a continuous conductive line between catalyst liners 28. Conductive plug 48 may not be necessary if a reliable contact can be made between nanotubes 42 and 44. Conductive plug 48 also provides a convenient location for a via in order to make contact to the conductive line. The remaining portions of metal plug layers in openings 20 and 22 also make convenient locations for making vias. Also the vias can be formed through insulating layer 14 prior to the formation of insulating layer 16 in order to make contact to active circuitry 12 or another underlying interconnect layer.

Various changes and modifications to the embodiments herein chosen for purposes of illustration will readily occur to those skilled in the art. For example, other nanotubes than carbon nanotubes may be used. In fact, rather than conductive nanotubes, it may desirable to have lateral insulating nanotubes. In such case, boron nitride nanotubes could be used. In such case at least the precursor would be different. One such precursor is borazine. Also if a trench is first formed for insulating layer 16, it may not be necessary to use a plasma for the growth of the nanotubes. Plasma may still be beneficial for other reasons such as being beneficial for low temperature formation of the nanotubes. Further, long interconnect lines can be manufactured from nanotube segments as described above. Reducing resistance is especially important for long interconnect lines, such as global interconnect lines, because they are the source of significant signal delay due to accumulated resistance over the extra length. To the extent that such modifications and variations do not depart from the spirit of the invention, they are intended to be included within the scope thereof which is assessed only by a fair interpretation of the following claims.

What is claimed is:

1. A semiconductor comprising:
   a substrate having active circuitry;
   a first insulating layer over the substrate;
   a second insulating layer of material overlying the the first insulating layer having a cavity;
   a first column of metallic catalyst material through the second insulating layer and having a side exposed to the cavity on a first side of the cavity;
   a second column of metallic catalyst material through the second insulating layer and having a side exposed to the cavity on a second side of the cavity;
   a third insulating layer over the second insulating layer having an opening centered over the cavity;
   a first nanotube in the cavity extending from the first column to a region under the opening; and
   a second nanotube in the cavity extending from the second column to the region under the opening and contacting the first nanotube.

2. The semiconductor of claim 1 wherein the first nanotube comprises a carbon nanotube and the first column of metallic catalyst material and the second column of metallic catalyst material comprise one of iron, cobalt, molybdenum, nickel or platinum.

3. The semiconductor of claim 1 wherein the first nanotube comprises a boron nitride nanotube.

4. The semiconductor of claim 1 further comprising a conductive via filling the opening for making electrical contact to the nanotube.

5. A semiconductor comprising:
   a substrate;
   a first insulating layer of a first type over the substrate;
   a second insulating layer of a second type different from the first type over the first insulating layer;
   a first column of metallic catalyst material through the first insulating layer and the second insulating layer;
   a second column of metallic catalyst material through the first insulating layer and the second insulating layer;

a cavity in the first insulating layer extending between the first column and the second column;

an opening in the second insulating layer over the cavity;

a first carbon nanotube in the cavity extending from the first column to a location under the opening; and a second carbon nanotube in the cavity extending from the second column to the first carbon nanotube.

6. The semiconductor of claim 5, wherein the first insulating layer comprises nitride and the second insulating layer comprises oxide.

7. The semiconductor of claim 5 further comprising a third insulating layer of the second type between the substrate and the first insulating layer.

8. The semiconductor of claim 5, wherein the first column comprises a catalyst liner and a metal plug.

9. The semiconductor of claim 8, wherein the catalyst liner comprises one of a group consisting of cobalt, iron, molybdenum, and nickel.

10. The semiconductor of claim 8, wherein the catalyst liner comprises cobalt.

11. The semiconductor of claim 8, wherein the first column further comprises a metal liner between the catalyst liner and the metal plug.

12. The semiconductor of claim 11, wherein the metal liner comprises tantalum.

13. The semiconductor of claim 5, wherein the cavity has a circular shape.

14. The semiconductor of claim 5, wherein the opening is over a center point of the cavity.

15. The semiconductor of claim 5, further comprising a conductive plug in the opening and in contact with the first and second carbon nanotubes.

16. A semiconductor, comprising:

a substrate;

a first insulating layer over the substrate;

a second insulating layer over the first insulating layer having a cavity that has a boundary;

a third insulating layer over the second insulating layer having an opening over the cavity;

a first column of metallic catalyst material through the first insulating layer and the second insulating layer at a first location along the boundary;

a second column of metallic catalyst material through the first insulating layer and the second insulating layer along a second location of the boundary; and a first nanotube and a second nanotube in the cavity, wherein the first nanotube is in contact with the first column and the second nanotube is in contact with the second column and the first nanotube.

* * * * *